United States Patent
Frulio et al.

(10) Patent No.: US 7,579,902 B2
(45) Date of Patent: Aug. 25, 2009

(54) CHARGE PUMP FOR GENERATION OF MULTIPLE OUTPUT-VOLTAGE LEVELS

(75) Inventors: Massimiliano Frulio, Milan (IT); Stefano Sivero, Capriate (IT); Marco Passerini, Lozza (IT); Fabio Tassan Caser, Arcore (IT)

(73) Assignee: Atmel Corporation, San Jose, CA (US)

( * ) Notice: Subject to any disclaimer, the term of this patent is extended or adjusted under 35 U.S.C. 154(b) by 5 days.

(21) Appl. No.: 11/608,941

(22) Filed: Dec. 11, 2006

(65) Prior Publication Data

US 2008/0136500 A1    Jun. 12, 2008

(51) Int. Cl.
    *G05F 1/10* (2006.01)
(52) U.S. Cl. .......................... 327/536; 363/59
(58) Field of Classification Search ................. 327/148, 327/157, 536; 363/59, 60
    See application file for complete search history.

(56) References Cited

U.S. PATENT DOCUMENTS

| 5,732,039 | A | * | 3/1998 | Javanifard et al. ........... 365/226 |
| 6,151,229 | A | * | 11/2000 | Taub et al. .................... 363/60 |
| 6,794,927 | B2 | * | 9/2004 | Bedarida et al. ............ 327/536 |
| 2002/0190781 | A1 | * | 12/2002 | Daak ........................... 327/536 |
| 2006/0083033 | A1 | * | 4/2006 | Myung et al. ................. 363/59 |

FOREIGN PATENT DOCUMENTS

| WO | WO-2008/073862 A2 | 6/2008 |
| WO | WO-2008/073862 A3 | 6/2008 |

OTHER PUBLICATIONS

"Application Serial No. PCT/US2007/086912, International Search Report mailed Sep. 30, 2008", 12 pages.

* cited by examiner

*Primary Examiner*—Lincoln Donovan
*Assistant Examiner*—William Hernandez
(74) *Attorney, Agent, or Firm*—Schwegman, Lundberg & Woessner P.A.

(57) ABSTRACT

A charge pump circuit for generating a plurality of voltages in excess of a supply voltage includes a first group of cascaded charge-pump stages, the input of a first charge pump stage in the first group being driven from the supply voltage. A first output stage has an input driven from the output of a last charge pump stage of the first group and an output coupled to a first voltage node. A second group of cascaded charge-pump stages is provided, the input of the first charge pump stage of the second group being driven from the output of the last charge pump stage of the first group. A second output stage has an input driven from the output of the last charge pump stage in the second group and an output coupled to a second voltage node.

10 Claims, 9 Drawing Sheets

US 7,579,902 B2

CHARGE PUMP FOR GENERATION OF MULTIPLE OUTPUT-VOLTAGE LEVELS

BACKGROUND OF THE INVENTION

1. Field of the Invention

The present invention relates to integrated circuit technology. More specifically, the present invention relates to charge pumps and to a charge pump for generation of multiple output-voltage levels.

2. The Prior Art

Charge pumps are switched-capacitor circuits employed to obtain either an output voltage higher than that of the power supply ($V_{DD}$) or a negative voltage in an electronic system. Charge pumps are widely used in the integrated circuit industry in many applications such as power ICs, filters, memories, etc. Flash memory devices are among these applications since high voltage levels are needed to perform flash memory operations such as program and erase. Moreover, due to the trend of increasingly lower voltage supply requirements, a voltage level higher than $V_{DD}$ is also needed for flash memory read operation.

As shown in FIG. 1, conventional charge pump circuits 10 comprise a series of pumping stages 12, the number of which depends on the voltage gain required, and usually an output stage 14. As will be appreciated by persons of ordinary skill in the art, each pumping stage includes capacitors, switches and drivers and is controlled by one or more clock signals. Voltage multiplication is obtained by properly charging and switching the pumping stage capacitors. Different ways to obtain voltage multiplication are possible by changing the topology of the pump stage, switching order, etc. For example, different charge pumps can be obtained by cascading Dickson stages or voltage doublers.

Whatever the principle of operation of the charge pump, it is often necessary to regulate the output voltage. In such instances, a regulator circuit 16 is required as is shown in FIG. 2 to ensure that the output voltage does not exceed a maximum value and does not drop below a minimum value.

Voltage regulation can be divided in two different types: pulse-skip regulation and linear regulation. Pulse-skip regulation operates by enabling the pump clocks only when the output pump voltage is lower than a given value and suppressing clock signals when the output pump voltage exceeds this value. Linear regulation operates by controlling the output voltage by means of a closed-loop error amplifier and a pass device. Both of these techniques are known in the art.

FIG. 3A is a block diagram showing a high-voltage generator with a pulse-skip regulation. The charge pump circuit 10 is supplied by $V_{DD}$ (the external supply voltage) at reference numeral 18 and delivers electric charge to the load 20 ($C_{LOAD}$) connected to the output. The regulation is accomplished by a comparator 22 whose non-inverting input is coupled to a fraction $V_f$ of the output voltage divided by resistors 24 and 26 and whose inverting input is coupled to a fixed voltage BGAP from a source such as a bandgap reference. If $V_f$>BGAP, the signal STOP at the output of comparator 22 is high and the output of the pump clock signal generator 28 is inhibited. On the other hand, if $V_f$<BGAP, signal STOP is low and clock signal generator 28 provides clock signals to the charge pump 10 therefore enabling the charge of the capacitance 20 at the output line $V_{OUT}$.

FIG. 3B is a block diagram illustrating a high-voltage generator with linear regulation. Again the charge pump is identified by reference numeral 10. In this configuration, clock generator 28 is always enabled. The linear regulation is implemented by an amplifier 30, a pass transistor 32 and a resistor network including resistors 24 and 26 in a closed-loop configuration. In both pulse-skip and linear regulation, the regulated output is given by:

$$OUT = r \cdot BGAP,$$

where $r=(R_{24}+R_{26})/R_{26}$. Resistors 24 and 26 are configurable to allow the user to select a specific output voltage.

In many applications, more than one high-voltage level is needed. For example in flash memories different high voltage levels are required for program, erase and read operation. Moreover, in some flash memory architectures all drivers that are employed are fabricated as n-channel transistors in order to improve memory performances and/or limit the driver silicon area. In these cases a first voltage to be passed by the driver is required and a second voltage, higher than the first, is required to bias the driver itself. It is worth noting that the use of the same voltage for the both tasks would lead to a loss in the output voltage that is equal to the n-channel transistor threshold voltage This is illustrated in FIGS. 4A and 4B, in which an example of an all n-channel word-line driver for a flash memory is shown employing transistors 40 and 42. The driver illustrated in FIGS. 4A and 4B switches between two values: 0 and $V_1$ (for example 0 for unselected word-line, $V_1$ for the selected word-line). FIG. 4A illustrates a correct driver biasing for the pull-up transistor 40 of the driver with a voltage $V_2$ sufficiently high to pass $V_1$ to the word-line without voltage loss, while FIG. 4B illustrates a non-optimal biasing leading to a drop in the word-line voltage equal to the threshold of transistor 40.

In such applications in which several high voltage levels are needed inside the chip, a plurality of charge pumps 10 are employed to generate the voltages $V_1$, $V_2$, and $V_n$ required as shown in FIG. 5A. Alternatively, as shown in FIG. 5B, a single charge pump 10 can be used to obtain the highest voltage required ($V_1$) and other voltages $V_2$ and $V_3$ can be obtained from linear regulators 16 such as shown in FIG. 3B coupled to the charge pump output. In the latter case (use of multiple linear regulators) a drop in efficiency is expected since each linear regulator draws current from the pump output voltage.

BRIEF DESCRIPTION OF THE INVENTION

According to one aspect of the present invention, a charge pump architecture has n pump stages and multiple output voltage levels. A first output voltage $V_1$ is obtained from $V_{DD}$ by the multiplication of the first m pump stages and a first output stage, while a second voltage $V_2$ is obtained from $V_{DD}$ by the multiplication of all the n pump stages and a second output stage. Additional output levels may be provided by coupling additional output stages to selected ones of the pump stages. Accordingly, a charge pump circuit for generating a plurality of voltages in excess of a supply voltage includes a first group of cascaded charge-pump stages, the input of a first charge pump stage in the first group being driven from the supply voltage. A first output stage has an input driven from the output of a last charge pump stage of the first group and an output coupled to a first voltage node. A second group of cascaded charge-pump stages is provided, the input of the first charge pump stage of the second group being driven from the output of the last charge pump stage of the first group. A second output stage has an input driven from the output of the last charge pump stage in the second group and an output coupled to a second voltage node.

According to another aspect of the present invention, a charge pump architecture has n pump stages and multiple output voltage levels. A first output voltage $V_1$ is obtained from $V_{DD}$ by the multiplication of the first m pump stages and a first output stage, while a second voltage $V_2$ is obtained from $V_{DD}$ by the multiplication of all the n pump stages and a second output stage. Each output voltage may be controlled by an independent pulse-skip regulator or linear regulator. Additional output levels may be provided by coupling additional output stages to selected ones of the pump stages. The n charge pump stages may all be controlled by a single set of clock signals or from multiple sets of clock signals.

BRIEF DESCRIPTION OF THE DRAWING FIGURES

Figure 8A:
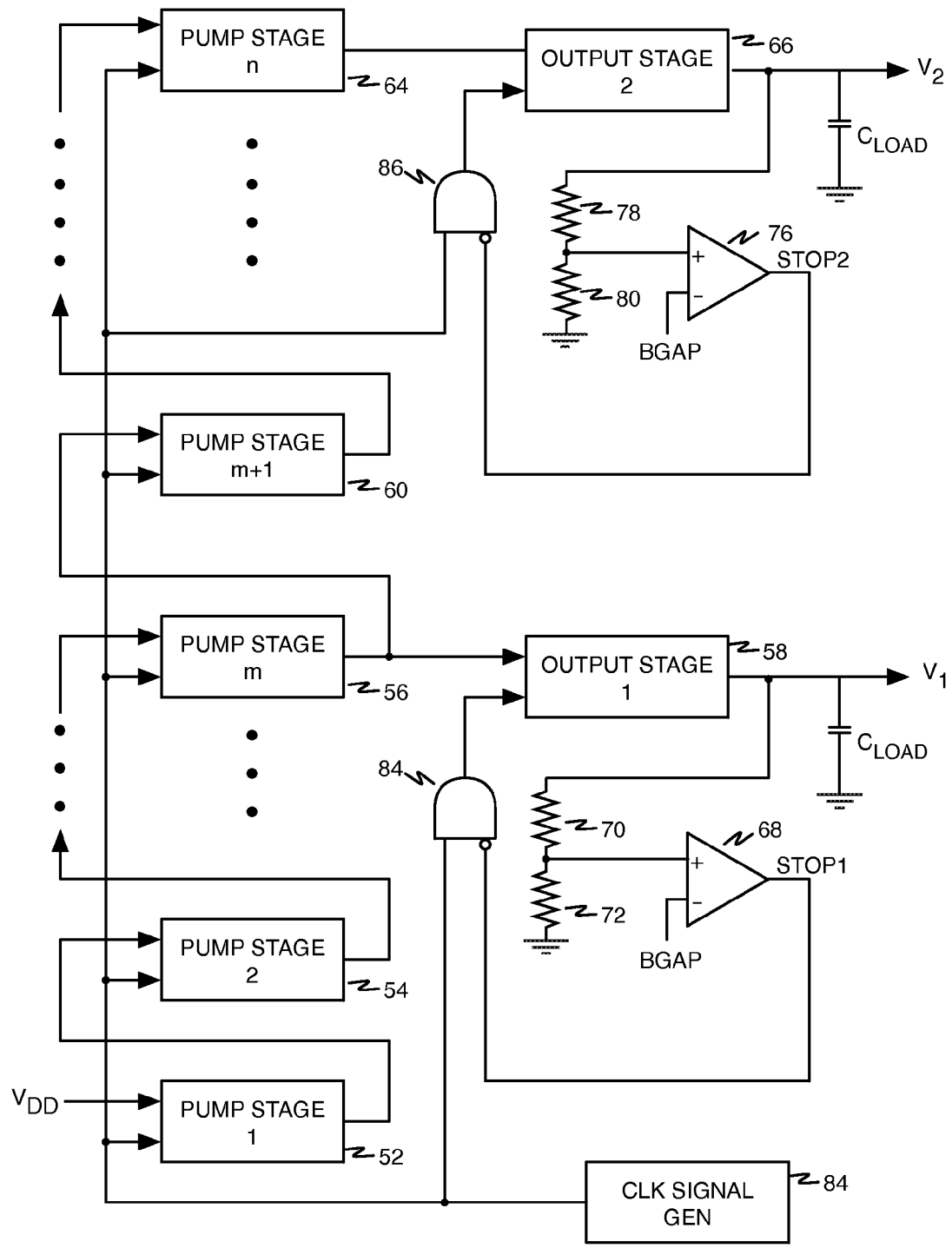

FIG. 8A a block diagram of an illustrative charge pump architecture according to the present invention having two output voltage levels and a single set of pump clock signals having output stages controlled by comparators.

Figure 8B:
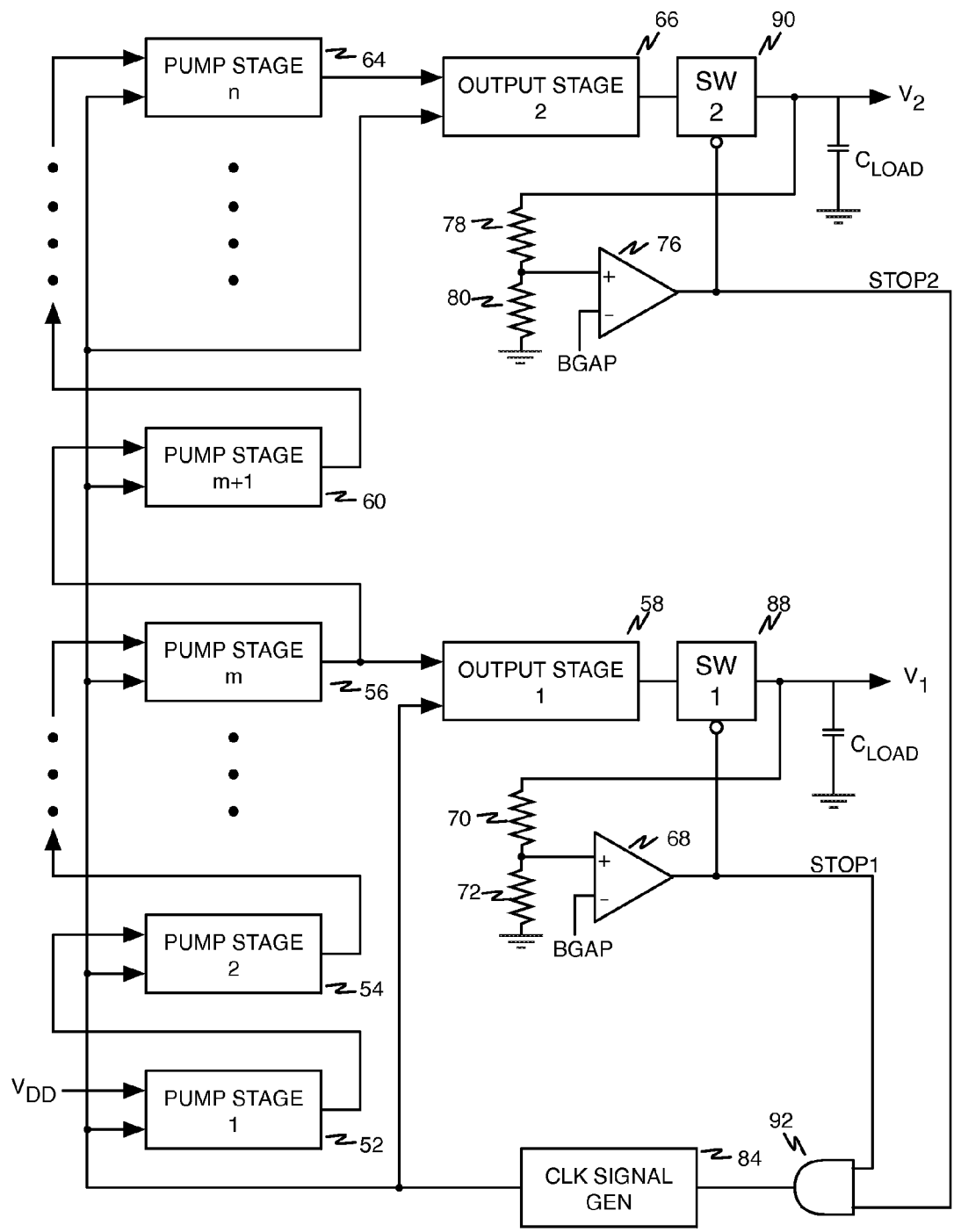

FIG. 8B is a block diagram of an illustrative charge pump architecture according to the present invention having output stages controlled by pump clock signals and output voltages switched by additional switches controlled by comparators.

Figure 9:
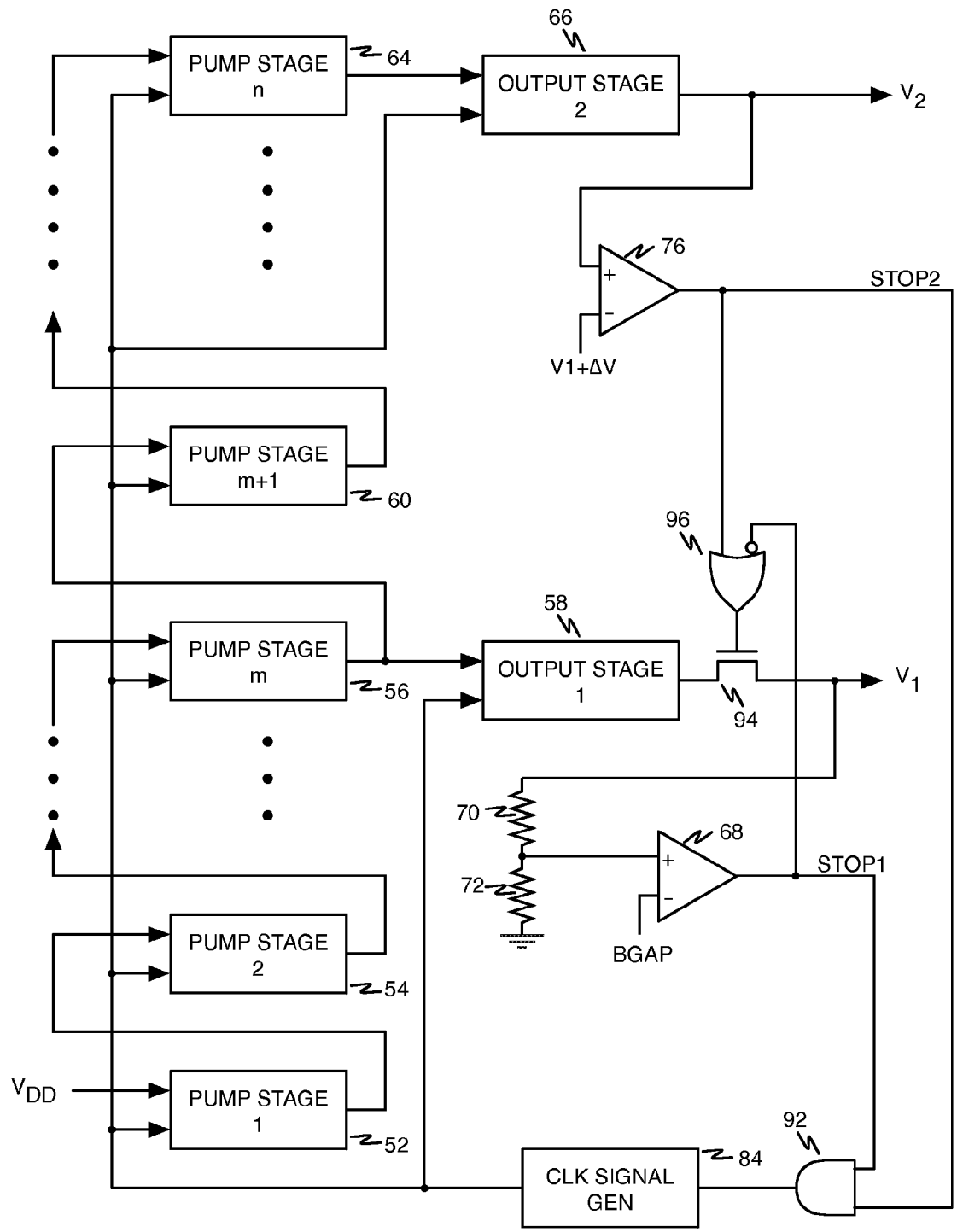

FIG. 9 is a block diagram of an illustrative charge pump architecture according to the present invention for an all-NMOS memory driver application.

DETAILED DESCRIPTION OF THE PRESENT INVENTION

Persons of ordinary skill in the art will realize that the following description of the present invention is illustrative only and not in any way limiting. Other embodiments of the invention will readily suggest themselves to such skilled persons.

Both prior-art methods used to generate a plurality of high voltage values require a considerable amount of silicon area and complexity, because they replicate charge pumps or linear regulators for each voltage level to be generated. The present invention aims to overcome these requirements.

The present invention provides for multiple output voltages in a single charge pump and employs different regulator methods for each output voltage, as needed. The present invention will be described in more details using an illustrative example in which two positive voltage levels $V_1$ and $V_2$ are needed. However, persons of ordinary skill in the art will appreciate that the present invention is not limited to the exemplary embodiment and that other numbers of output voltages may be provided according to the principles disclosed herein.

Figure 1:
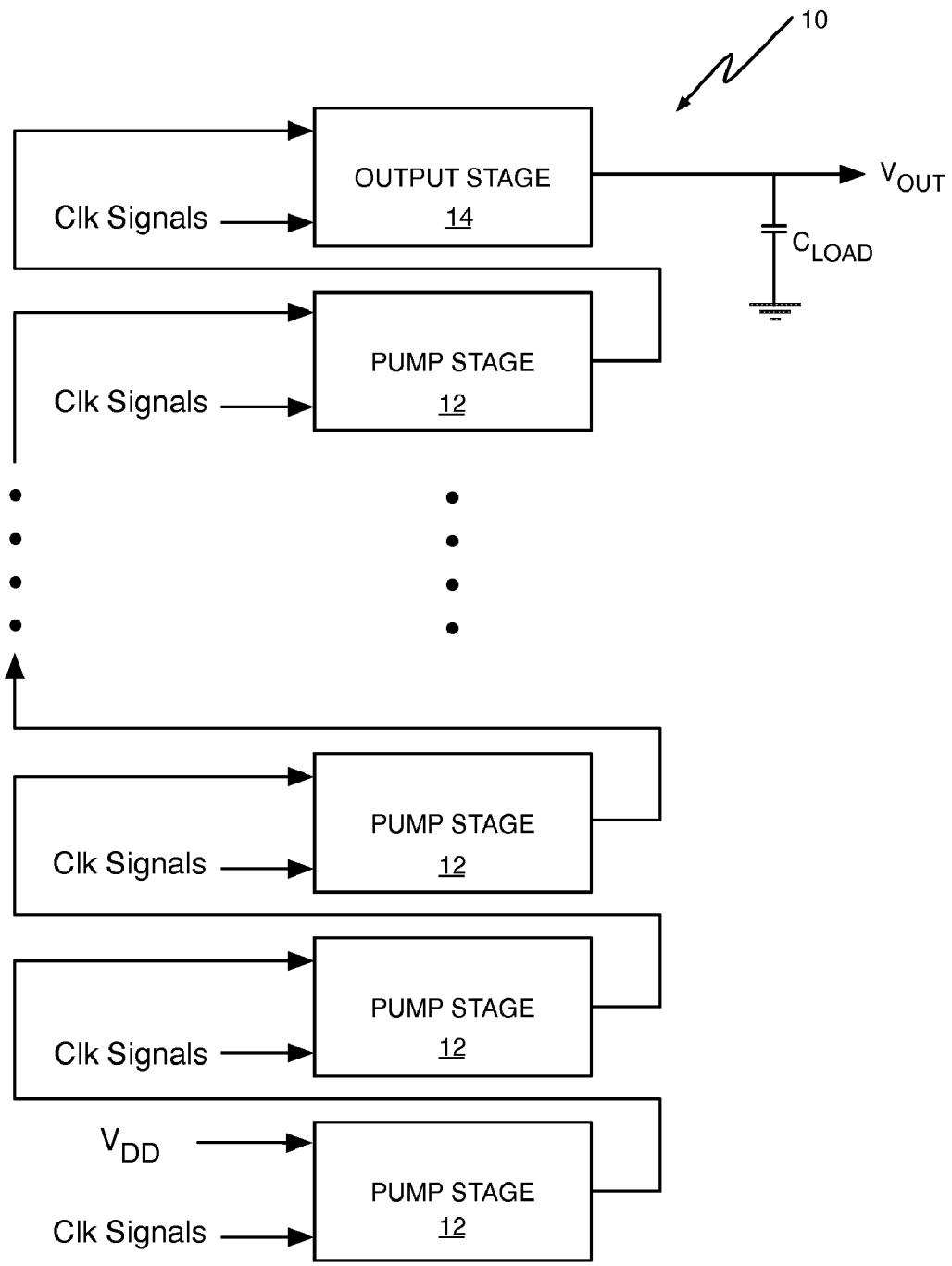
FIG. 1 is a block diagram of a typical prior-art charge pump circuit.
Figure 2:
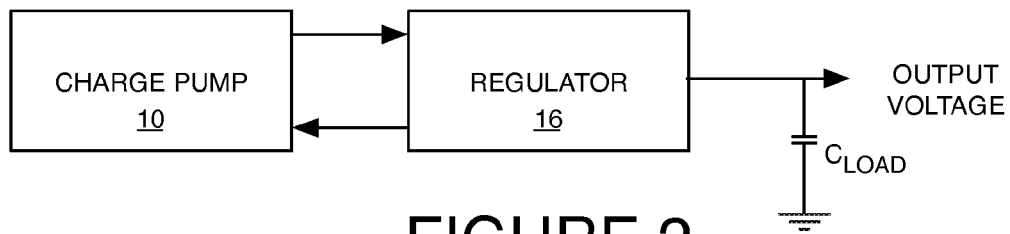
FIG. 2 is a block diagram of a typical prior-art regulated voltage generator.
Figure 3A:
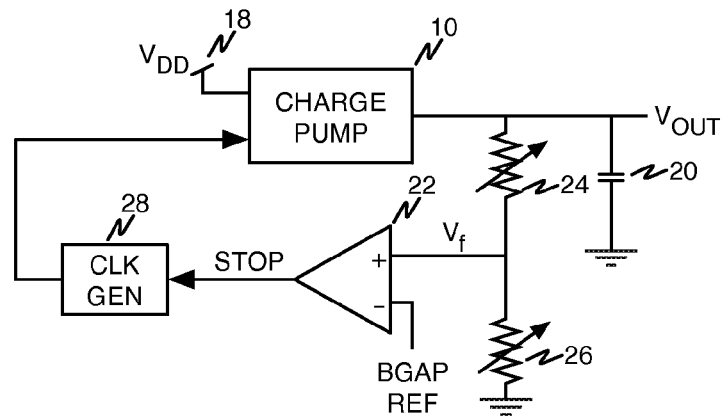
FIG. 3A is a diagram illustrating a typical prior-art charge pump with a pulse-skip regulator.
Figure 3B:
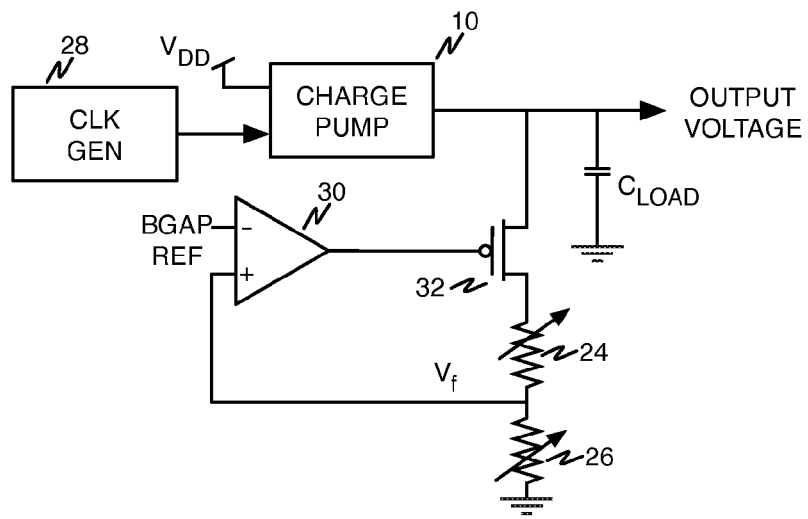
FIG. 3B is a diagram illustrating a typical prior-art charge pump with a linear regulator.
Figure 4A:
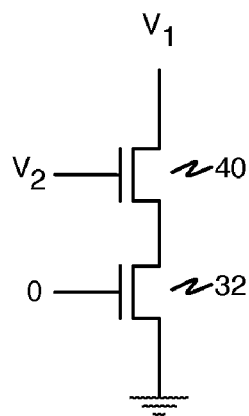
FIG. 4A and FIG. 4B are schematic diagrams illustrating a prior-art all-NMOS word-line driver under optimal bias and with non-optimal bias conditions.
Figure 4B:
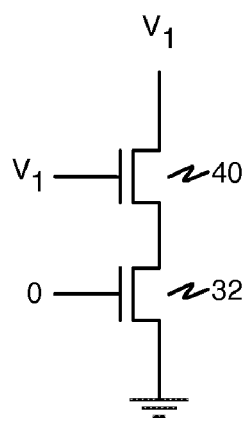
Figure 5A:
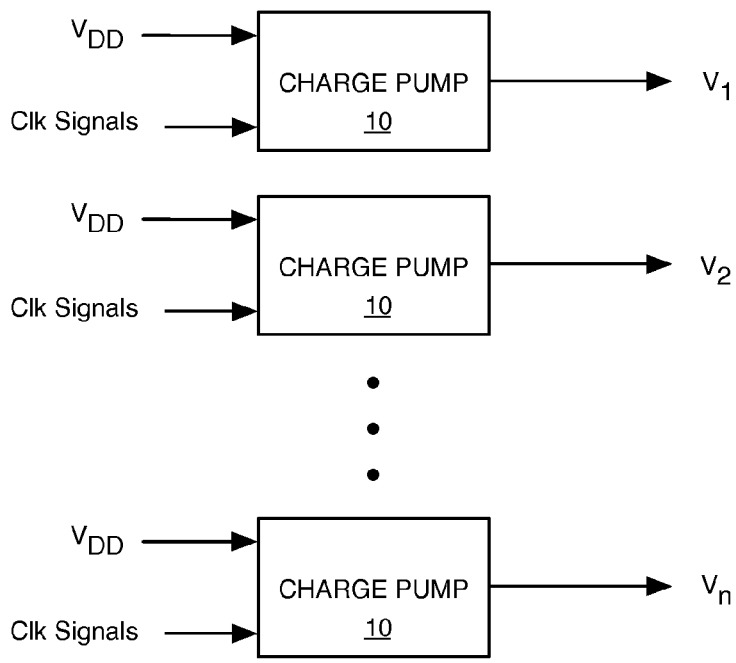
FIG. 5A and FIG. 5B are block diagrams illustrating, respectively, prior-art solutions for multiple high voltage generation inside the chip using multiple charge pumps, and a single charge pump with multiple linear regulators.
Figure 5B:
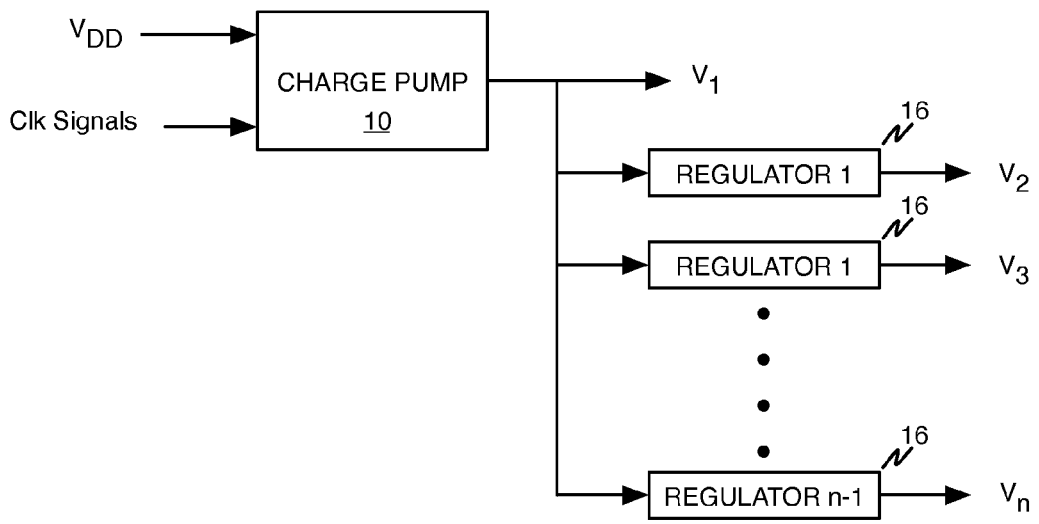
Figure 6:
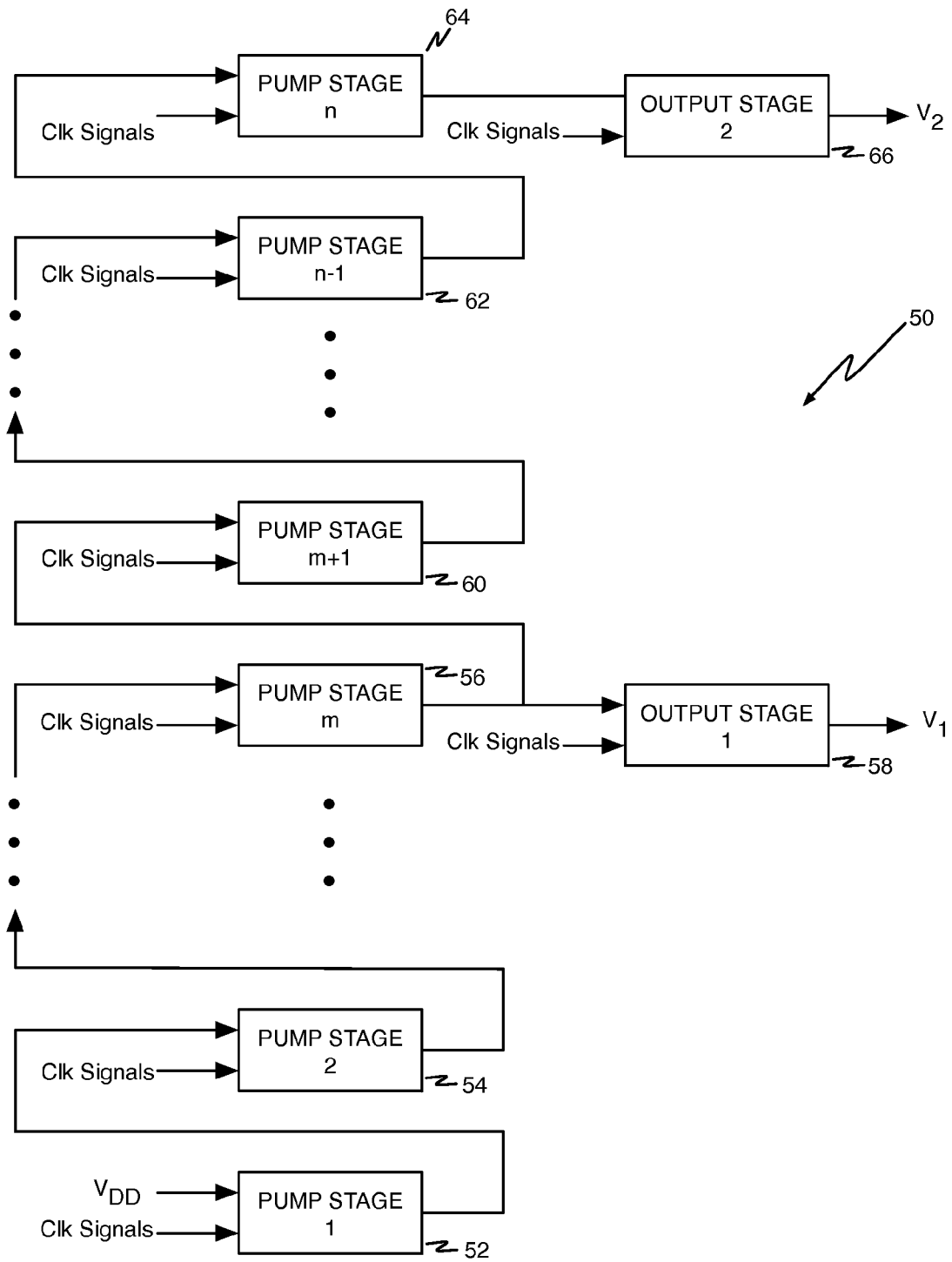
FIG. 6 is a block diagram of an illustrative charge pump architecture according to the present invention having two output voltage levels.

Referring now to FIG. 6, a block diagram shows an illustrative charge pump architecture 50 according to the present invention having two output voltage levels. The first output voltage $V_1$ is obtained from $V_{DD}$ by the multiplication of the first m pump stages, while the second voltage $V_2$ is obtained from $V_{DD}$ by the multiplication of all the n pump stages. Thus, pump stage 52 uses $V_{DD}$ as an input voltage. The output of pump stage 52 drives the input of pump stage 54. The output of pump stage 54 drives successive pump stages (not shown), the output of the last of which drives the input of pump stage 56. The output of pump stage 56 drives output stage 58.

The output of pump stage 58 also drives the input of pump stage 60. The output of pump stage 60 drives successive pump stages (not shown), the output of the last of which drives the input of pump stage 62. The output of pump stage 62 drives the input of pump stage 64. The output of pump stage 64 drives output stage 66. Pump stages 52, 54, 56, 60, 62, and 64, and output stages 58 and 66 can be driven by the same clock signals or different clock signals as is known in the art.

As is well known in the art, in the case of the use of a common four-phase Dickson charge pump circuit, the two output voltages are limited by:

$$V_1 R(m+1)V_{DD}$$

$$V_2 R(n+1)V_{DD}$$

Figure 7:
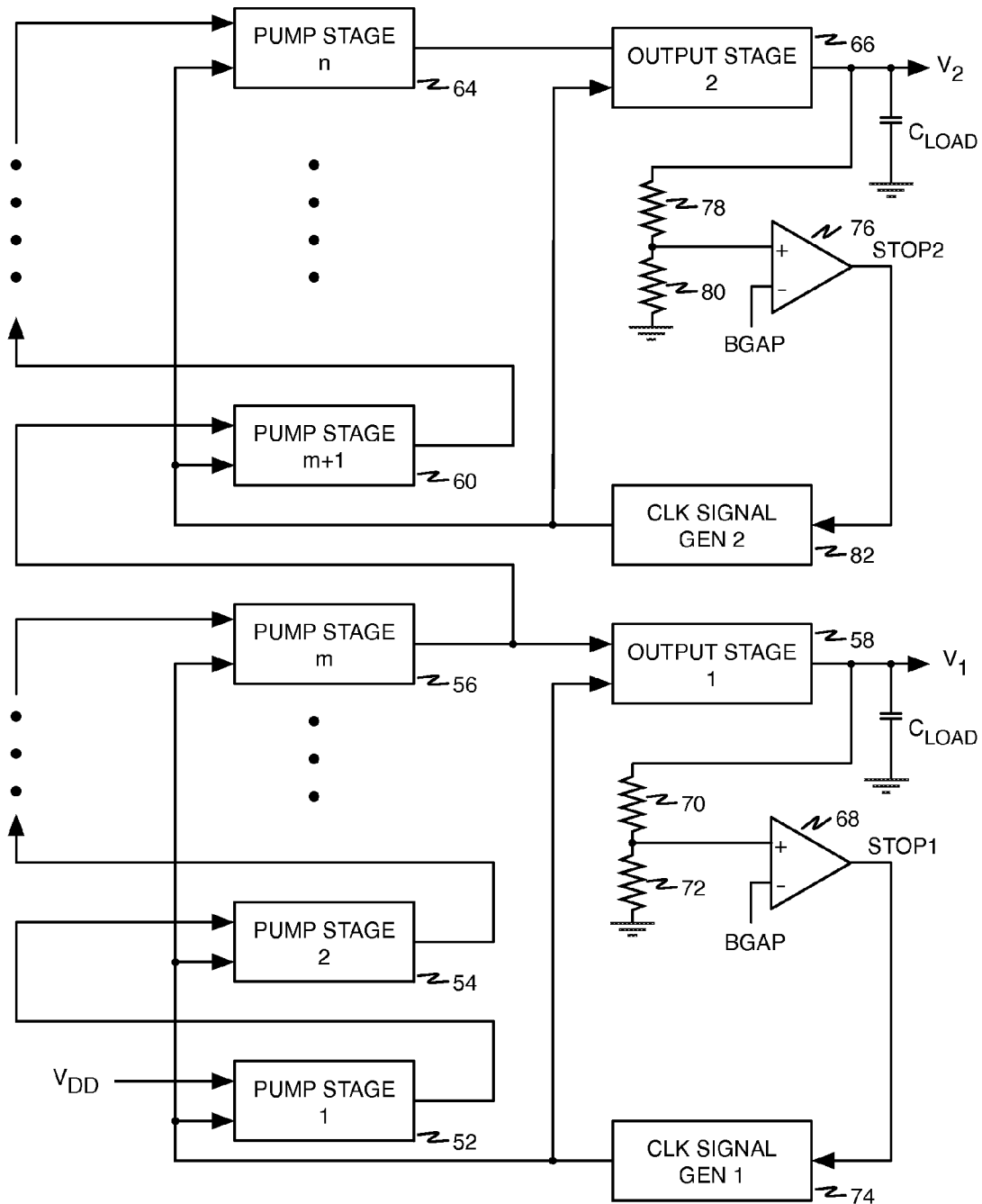
FIG. 7 is a block diagram of an illustrative charge pump architecture according to the present invention having two independent pulse-skip regulators.

Different methods are available to regulate the two output voltages to desired levels in accordance with the present invention. Referring now to FIG. 7, it may be seen that one example of a method that may be used in accordance with the present invention is pulse-skip regulation to control both $V_1$ and $V_2$. Elements in FIG. 7 performing the same function as like elements in FIG. 6 will be designated by the same reference numerals used in FIG. 6.

As in the embodiment of FIG. 6, the first output voltage $V_1$ is obtained from $V_{DD}$ by the multiplication of the first m pump stages, while the second voltage $V_2$ is obtained from $V_{DD}$ by the multiplication of all the n pump stages. Thus, pump stage 52 uses $V_{DD}$ as an input voltage. The output of pump stage 52 drives the input of pump stage 54. The output of pump stage 54 drives successive pump stages (not shown), the output of the last of which drives the input of pump stage 56. The output of pump stage 56 drives output stage 58.

The output of pump stage 58 also drives the input of pump stage 60. The output of pump stage 60 drives successive pump stages (not shown), the output of the last of which drives the input of pump stage 64. The output of pump stage 64 drives output stage 66. Pump stages 52, 54, 56, 60, and 64, and output stages 58 and 66 are driven by the same clock signals as is known in the art.

In the embodiment shown in FIG. 7, two sets of clock signals are independently controlled by the comparators of the two pulse-skip regulators. The output of output stage 58 is presented to the non-inverting input of comparator 68 through a voltage divider formed from resistors 70 and 72. The inverting input of comparator 68 is driven by a reference voltage such as a bandgap reference as is known in the art. The output of comparator 68 is a STOP1 signal that, when at a logic "one" level, inhibits a first clock generator circuit 74 whose output drives pump stages 52, 54, and 56, and output stage 58. Similarly, the output of output stage 66 is presented to the non-inverting input of comparator 76 through a voltage divider formed from resistors 78 and 80. The inverting input of comparator 76 is driven by a reference voltage such as a bandgap reference as is known in the art. The output of comparator 76 is a STOP2 signal that, when at a logic "one" level, inhibits a second clock generator circuit 82 whose output drives pump stages 60 and 64, and output stage 66. Persons of ordinary skill in the art will appreciate that, although comparators for skip-pulse regulators are represented as voltage comparators in FIG. 7 and following figures, they could be implemented as current comparators as well with proper changes in the topology of the electrical circuit. The detailed description herein assumes for simplicity that the comparators are voltage comparators but the invention is not intended to be limited to the use of voltage comparators.

If both $V_1$ and $V_2$ are below their respective targets, both signals STOP1 and STOP2 are low thus enabling the pumping of all stages of the charge pump circuit. On the other hand if only one output is below target, only one of the two STOP signals is low, thus enabling the pumping of the first group of stages only or the pumping of the second group of stages only depending on which of the two output voltages is below target.

One alternative solution is depicted in FIG. 8A. Elements in FIG. 8A performing the same function as like elements in FIGS. 6 and 7 will be designated by the same reference numerals used in those figures.

The charge pump portion of the circuit of FIG. 8A operates in the manner described with respect to the circuits of FIGS. 6 and 7. In the circuit shown in FIG. 8A, the two voltage regulators control concurrently the same set of clock signals from clock generator 84. The clock signals are routed to pump stages 52, 54, and 56, and output stage 58 through AND gate 86, where the STOP1 output of comparator 68 controls the other input of AND gate 86. Similarly, the clock signals are routed to pump stages 60 and 64, and output stage 66 through AND gate 88, where the STOP2 output of comparator 76 controls the other input of AND gate 88. In the circuit of FIG. 8A, if one of the two outputs $V_1$ or $V_2$ is low, then the clock signals are enabled through AND gates 84 and 86 and all the stages of the pump are active. Output stage 58 is enabled only if signal STOP1 is low, i.e. only if $V_1$ is below target, and output stage 66 is enabled only if signal STOP2 is low, i.e. only if $V_2$ is below target. Otherwise the clock signals are disabled.

Output load capacitances of nodes $V_1$ and $V_2$ are usually much higher than that of internal pump nodes. This avoids $V_1$ and $V_2$ rising appreciably above the regulated value when their respective output stages are turned on. However, additional circuits can be added as is known in the art to recover small overshoots, if needed. The circuit of FIG. 8A avoids the die area that would otherwise be used if two different sets of clock signal generators and drivers were employed.

Referring now to FIG. 8B, an alternative to the circuit presented in FIG. 8A is shown. The charge pump portion of the circuit of FIG. 8B also operates in the manner described with respect to the circuits of FIGS. 6 and 7.

The circuit shown in FIG. 8B employs a switch 88 connected between output stage 58 and VP2 and high voltage line $V_1$ and a switch 90 connected between output stage 66 and high voltage line $V_2$. In this case, output stages 58 and 66 are controlled by clock signals from clock generator 84 but switch 88 connects $V_1$ with output stage 58 only when STOP1=1 and switch SW2 connects $V_2$ with output stage 58 only when STOP2=0. If both STOP1 and STOP2 are true, the clock generator 84 is disabled by AND gate. Variations of this invention are also possible.

In some applications, only one of the two high voltages (e.g., $V_1$) needs to be finely regulated while the other (e.g., $V_2$) must be above a certain value $V_1+\Delta V$ but must not exceed a maximum value $V_{max}$. This is a typical situation in flash memory devices featuring an all-NMOS driver circuit.

An exemplary charge pump according to the present invention for performing this function is shown in FIG. 9. The charge pump portion of the circuit of FIG. 9 also operates in the manner described with respect to the circuits of FIGS. 6 and 7.

In the circuit depicted in FIG. 9, the high voltage line $V_1$ is connected to output stage 58 through a pass transistor 94. Comparator 68 and resistive divider network 70 and 72 are connected to form a conventional pulse-skip regulator. Comparator 76 senses voltage $V_2$ and compares it with $V_1+\Delta V$.

If signal STOP2 is low (i.e. $V_2<V_1+\Delta V$), the output of AND gate 92 is low and the clock signals are activated to enable pumping on all stages irrespective of the value of signal STOP1. In this case, if STOP1 is low, i.e. if $V_1$ is below target, then pass transistor 94 is turned on by the inverted input of OR gate 96 and $V_1$ is connected to the output of output stage 58. On the other hand, if STOP1 is high, i.e. $V_1$ is above target, then pass transistor 94 is off by the inverted input of OR gate 96 and high voltage line $V_1$ is disconnected from the output of output stage 58. If signal STOP2 is high, then the pass transistor 94 is turned on by the non-inverted input of OR gate 96 and the signals are controlled by STOP1 via AND gate 92. To ensure that the voltage $V_2$ does not exceed a maximum value $V_{max}$ it is enough to choose a number of stages that satisfies the relationship:

$$\Delta V < (n-m)V_{DD} < V_{max} - V_1$$

As will be appreciated by persons of ordinary skill in the art, additional circuits can be added to all the circuits shown herein to recover the small overshooting generated on high voltage lines due to switching activities, if needed.

The present invention avoids the need to replicate charge pump circuits or linear regulator circuits that would lead to an increase of the occupied silicon area. The present invention allows more than one output for a single charge pump circuit. The different output can be regulated with pulse-skip regulators each controlling a different group of pump stages. Alternative implementations use a single set of clock signals, hence enabling all pump stages at the same time.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A charge pump circuit for generating a plurality of voltages in excess of a supply voltage and including:
   a first group of cascaded charge-pump stages each having an input and an output, the input of a first one of the first group of cascaded charge pump stages being driven from the supply voltage, the input of each successive one of the first group of cascaded charge pump stages being driven from the output of the preceding stage of the first group of cascaded charge pump stages;
   a first output stage having an input driven from the output of a last one of the first group of cascaded charge pump stages and an output coupled to a first voltage node;
   a second group of cascaded charge-pump stages each having an input and an output, the input of a first one of the second group of cascaded charge pump stages being driven from the output of the last one of the first group of cascaded charge pump stages, the input of each successive one of the second group of cascaded charge-pump stages being driven from the output of the preceding stage of the second group of cascaded charge-pump stages;
   a second output stage having an input driven from the output of a last one of the second group of cascaded charge pump stages and an output coupled to a second voltage node;

a clock generator coupling a single set of clock signals to the charge pump stages in the first and second groups, and the first and second output stages, the clock generator having a disable input;

a first switch coupled between the first output stage and the first output node and having a control element;

a second switch coupled between the second output stage and the second output node and having a control element;

a first comparator coupled to a reference voltage and to the first output node through a voltage divider, the first comparator having an output coupled to the control element of the first switch;

a second comparator coupled to a reference voltage and to the second output node through a voltage divider, the second comparator having an output coupled to the control element of the second switch; and an AND gate having a first input coupled to the output of the first comparator, a second input coupled to the output of the second comparator, and an output coupled to the disable input of the clock generator.

2. A charge pump circuit for generating a plurality of voltages in excess of a supply voltage and including:

a first group of cascaded charge-pump stages each having an input and an output, the input of a first one of the first group of cascaded charge pump stages being driven from the supply voltage, the input of each successive one of the first group of cascaded charge pump stages being driven from the output of the preceding stage of the first group of cascaded charge pump stages;

a first output stage having an input driven from the output of a last one of the first group of cascaded charge pump stages and an output coupled to a first voltage node;

a second group of cascaded charge-pump stages each having an input and an output, the input of a first one of the second group of cascaded charge pump stages being driven from the output of the last one of the first group of cascaded charge pump stages, the input of each successive one of the second group of cascaded charge-pump stages being driven from the output of the preceding stage of the second group of cascaded charge-pump stages;

a second output stage having an input driven from the output of a last one of the second group of cascaded charge pump stages and an output coupled to a second voltage node;

a clock generator coupling a single set of clock signals to the charge pump stages in the first and second groups, and the first and second output stages, the clock generator having a disable input;

a switch coupled between the first output stage and the first output node and having a control element;

a first comparator coupled to a first reference voltage and to the first output node through a voltage divider, the first comparator having an output;

a second comparator coupled to a second reference voltage and to the second output node, the second comparator having an output;

an AND gate having a first input coupled to the output of the first comparator, a second input coupled to the output of the second comparator, and an output coupled to the disable input of the clock generator; and an OR gate having a non-inverted input coupled to the output of the first comparator, an inverted input coupled to the output of the second comparator, and an output coupled to the control element of the switch.

3. A charge pump circuit for generating a plurality of voltages in excess of a supply voltage and including:

a first group of cascaded charge-pump stages each having an input and an output, the input of a first one of the first group of cascaded charge pump stages being driven from the supply voltage, the input of each successive one of the first group of cascaded charge pump stages being driven from the output of the preceding stage of the first group of cascaded charge pump stages;

a first output stage having an input driven from the output of a last one of the first group of cascaded charge pump stages and an output coupled to a first voltage node;

a second group of cascaded charge-pump stages each having an input and an output, the input of a first one of the second group of cascaded charge pump stages being driven from the output of the last one of the first group of cascaded charge pump stages, the input of each successive one of the second group of cascaded charge-pump stages being driven from the output of the preceding stage of the second group of cascaded charge-pump stages;

a second output stage having an input driven from the output of a last one of the second group of cascaded charge pump stages and an output coupled to a second voltage node; and a clock generator coupling a single set of clock signals to the charge pump stages in the first and second groups, and the first and second output stages, the clock generator having a disable input;

a first switch coupled between the first output stage and the first output node and having a control element;

a second switch coupled between the second output stage and the second output node and having a control element; and a first comparator coupled to a first reference voltage and to the first output node through a voltage divider, the first comparator having an output.

4. The charge pump circuit of claim 3, comprising:

a second comparator coupled to a reference voltage and to the second output node through a voltage divider, the second comparator having an output coupled to the control element of the second switch.

5. The charge pump circuit of claim 3, wherein at least one of the first and second voltage nodes is coupled to its output stage using a pulse-skip voltage regulator.

6. The charge pump circuit of claim 3, wherein at least one of the first and second voltage nodes is coupled to its output stage using a linear voltage regulator.

7. The charge pump circuit of claim 3, wherein a set of clock signals for operating the charge pump stages in the first group are controlled by a pulse-skip voltage regulator.

8. The charge pump circuit of claim 3, wherein a set of clock signals for operating the charge pump stages in the second group are controlled by a pulse-skip voltage regulator.

9. The charge pump circuit of claim 3, wherein:

a single set of clock signals operates the charge pump stages in the first and second groups; and a pulse-skip voltage regulator coupled to the output of the first output stage controls the provision of the set of clock pulses to the first output stage.

10. The charge pump circuit of claim 3, wherein:

a single set of clock signals operates the charge pump stages in the first and second groups; and a pulse-skip voltage regulator coupled to the output of the second output stage controls the provision of the set of clock pulses to the second output stage.

* * * * *

UNITED STATES PATENT AND TRADEMARK OFFICE
CERTIFICATE OF CORRECTION

| | |
|---|---|
| PATENT NO. | : 7,579,902 B2 |
| APPLICATION NO. | : 11/608941 |
| DATED | : August 25, 2009 |
| INVENTOR(S) | : Frulio et al. |

Page 1 of 1

It is certified that error appears in the above-identified patent and that said Letters Patent is hereby corrected as shown below:

In column 2, line 19, after "voltage" insert -- . --.

In column 4, line 18, delete "64.The" and insert -- 64. The --, therefor.

In column 5, line 57, delete "STOP1=1" and insert -- STOP1=0 --, therefor.

Signed and Sealed this

Twelfth Day of January, 2010

David J. Kappos
*Director of the United States Patent and Trademark Office*